United States Patent
Sarwar et al.

(10) Patent No.: US 10,598,732 B2
(45) Date of Patent: Mar. 24, 2020

(54) EARLY DETECTION OF MOTOR STATOR WINDING FAULTS

(71) Applicant: GM GLOBAL TECHNOLOGY OPERATIONS LLC, Detroit, MI (US)

(72) Inventors: Azeem Sarwar, Rochester Hills, MI (US); Madi Zholbaryssov, Champaign, IL (US); Wesley G. Zanardelli, Rochester, MI (US); Yo Chan Son, Rochester Hills, MI (US); Ethan M. Blakley, Waterford, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 38 days.

(21) Appl. No.: 15/978,720

(22) Filed: May 14, 2018

(65) Prior Publication Data

US 2019/0346509 A1    Nov. 14, 2019

(51) Int. Cl.
*H02K 11/26* (2016.01)
*G01R 31/34* (2020.01)
*H02K 21/12* (2006.01)

(52) U.S. Cl.
CPC ......... *G01R 31/343* (2013.01); *G01R 31/346* (2013.01); *H02K 11/26* (2016.01); *H02K 21/12* (2013.01)

(58) Field of Classification Search
CPC ..... H02K 11/26; G01R 31/346; G01R 31/343
USPC ........................................................ 318/490
See application file for complete search history.

(56) References Cited

U.S. PATENT DOCUMENTS

| | | | | |
|---|---|---|---|---|
| 9,294,005 | B2 * | 3/2016 | Tallam | H02M 7/125 |
| 2010/0320953 | A1 * | 12/2010 | Yeh | G01R 31/343 |
| | | | | 318/490 |
| 2011/0187304 | A1 * | 8/2011 | Anwar | G01R 31/343 |
| | | | | 318/490 |
| 2013/0057297 | A1 * | 3/2013 | Cheng | H02M 1/32 |
| | | | | 324/548 |
| 2014/0117912 | A1 * | 5/2014 | Gajic | G01R 31/343 |
| | | | | 318/490 |
| 2017/0003348 | A1 * | 1/2017 | Fedigan | G01R 31/343 |

\* cited by examiner

*Primary Examiner* — Jorge L Carrasquillo
(74) *Attorney, Agent, or Firm* — Cantor Colburn LLP (57) ABSTRACT

A method and system for detecting a fault in a permanent magnet synchronous motor (PMSM), operably connected to a controller. The method includes receiving at a controller a stator voltages and currents for the PMSM, computing a negative sequence current and a negative sequence voltage for the PMSM; and determining if conditions are satisfied for monitoring for a fault of the PMSM. The method also includes ascertaining a change in the negative sequence current and a change in the negative sequence voltage for a selected time duration, calculating a ratio of the change in the negative sequence current and the negative sequence voltage corresponding to a negative sequence admittance for the PMSM, determining if the negative sequence admittance differs from a nominal value in excess of a threshold; and identifying the stator winding as faulted if the ratio exceeds the threshold.

22 Claims, 6 Drawing Sheets

EARLY DETECTION OF MOTOR STATOR WINDING FAULTS

INTRODUCTION

The subject matter disclosed herein generally relates to a motors and motor control and, more particularly, to detecting faults in permanent magnet synchronous motors (PMSM) and fault mitigation in systems that employ them.

Vehicle systems commonly include a variety of motor controlled systems. For example, propulsion systems, actuation systems for control functions, doors, windows, environmental control systems and the like. In some systems, such as propulsion systems and some actuation systems for control function, detection of motor faults, or interconnect wiring faults, is very important to the proper operation of the system in the vehicle.

Applications of permanent magnet synchronous machines (PMSMs) are proliferating due to power density, efficiency gains, and simplicity in control algorithms. Faults in an electric machine can occur for numerous reasons, including, but not limited to, mechanical vibration, thermal cycling, thermal shock, manufacturing defects and improper maintenance. Some typical faults that can occur in a PMSM drive system include winding failures, open circuits in the motor windings or wiring harness, short circuits of the motor windings internally, to each other, or to ground, and mechanical faults. A winding short in a rotating PMSM can result in induced voltages generating a current flow in a low resistance path, unbalance stator voltages, decreased torque production, and efficiency. Currents beyond the rated current for the winding can then circulate in the loop of the conductor even at low speeds due to low resistance. Exceeding the rated current of the winding can cause localized excessive heating, hot spots, overheating of the machine and can lead to potentially harmful circumstances. The rapid detection of such a winding fault will prevent damage to the machine, the drive electronics, and other equipment.

Methods for detection of motor wiring faults have classically been limited to a non-real-time test signal injection, and phase-by-phase continuity checks, or limited, real-time, current monitoring, and summation (for a three-phase motor, the three phase currents should add to zero). While the phase-by-phase continuity check can be very thorough, it cannot be performed under operational conditions such as when a motor is being commanded in operation. The current sum monitor can be performed when operating, however, its fault detection capability is limited (i.e., phase-to-phase shorts and singular open phases cannot be detected).

Accordingly for at least the above discussed reasons, as well as others, there is a desire to provide improved control and fault detection methods for motors.

BRIEF DESCRIPTION

According to one embodiment described herein is a method for detecting a fault in a permanent magnet synchronous motor (PMSM), operably connected to a controller. The method includes receiving at a controller stator voltages and currents for the PMSM, computing a negative sequence current and a negative sequence voltage for the PMSM, and determining if conditions are satisfied for monitoring for a fault of the PMSM. The method also includes ascertaining a change in the negative sequence current and a change in the negative sequence voltage for a selected time duration, calculating a ratio of the change in the negative sequence current and the negative sequence voltage to obtain a negative sequence admittance for the PMSM, and determining if at least one of a real and an imaginary part of the calculated ratio exceeds a threshold. Finally, the method includes identifying the PMSM as faulted if the ratio exceeds the threshold.

In addition to one or more of the features described above, or as an alternative, further embodiments may include that the determining if selected conditions for monitoring are satisfied includes ensuring that $\Delta V_n \geq$ a third preselected threshold, and $V_p \geq$ a fourth preselected threshold; and yet each of $\alpha, \beta, \gamma. \leq$ are less than preselected thresholds respectively.

In addition to one or more of the features described above, or as an alternative, further embodiments may also include that the third preselected threshold is one volt and the fourth preselected threshold is 10 volts.

In addition to one or more of the features described above, or as an alternative, further embodiments may include that the selected duration is chosen to ensure that the conditions for monitoring are satisfied.

In addition to one or more of the features described above, or as an alternative, further embodiments may include that the selected duration is based on a sampling period.

In addition to one or more of the features described above, or as an alternative, further embodiments may include that the negative sequence admittance corresponds to ratio of the change a negative sequence current and a negative sequence voltage.

In addition to one or more of the features described above, or as an alternative, further embodiments may include that the first selected threshold is based on a nominal negative sequence admittance value identified under normal operating conditions.

In addition to one or more of the features described above, or as an alternative, further embodiments may include that the first selected threshold is 10% of a nominal value.

In addition to one or more of the features described above, or as an alternative, further embodiments may include the method further including computing a negative sequence impedance from the negative sequence current and the negative sequence voltage, computing an absolute value of the negative sequence impedance, determining if the absolute value of the negative sequence impedance is less than a fifth selected threshold, and identifying the stator winding as faulted if the absolute value of the negative sequence impedance is less than the fifth selected threshold.

In addition to one or more of the features described above, or as an alternative, further embodiments may include that the fifth selected threshold is based on a deviation from a nominal negative sequence impedance value.

In addition to one or more of the features described above, or as an alternative, further embodiments may include that the fifth selected threshold is 10% of a nominal value of a prefault the negative sequence impedance.

In addition to one or more of the features described above, or as an alternative, further embodiments of the method may include computing a negative sequence impedance from the negative sequence current and the negative sequence voltage, computing an average value of the negative sequence impedance, determining if the residual of at least one of the negative sequence current and negative sequence voltage exceeds a sixth selected threshold, and identifying the stator winding as faulted if the residual of at least one of the negative sequence current and negative sequence voltage exceeds the sixth selected threshold.

In addition to one or more of the features described above, or as an alternative, further embodiments may include that the sixth selected threshold is based on a deviation from the nominal averaged negative sequence impedance under normal conditions.

In addition to one or more of the features described above, or as an alternative, further embodiments may include that the sixth selected threshold is 10% of the nominal negative sequence impedance.

In addition to one or more of the features described above, or as an alternative, further embodiments of the method may include computing a negative sequence impedance from the negative sequence current and the negative sequence voltage, computing a magnitude of the negative sequence impedance, and determining if the magnitude of the negative sequence impedance is less than a seventh selected threshold. Further embodiments of the method may also include computing an average value of the negative sequence impedance, determining if the residual of at least one of the negative sequence current and negative sequence voltage exceeds eighth selected threshold, and identifying the stator winding as faulted based the fastest of the determining if at least one of the real and imaginary part of the calculated ratio exceeds a first selected threshold the magnitude of the negative sequence impedance is less than the second selected threshold, determining if the magnitude of the negative sequence impedance is less than a seventh selected threshold, and determining if the residual of at least one of the negative sequence current and negative sequence voltage exceeds the eighth selected threshold.

In addition to one or more of the features described above, or as an alternative, further embodiments may include controlling the PMSM based on the identifying of a faulted stator winding of the PMSM.

In addition to one or more of the features described above, or as an alternative, further embodiments may include controlling the PMSM based on the identifying of a fault includes disabling the PMSM.

In addition to one or more of the features described above, or as an alternative, further embodiments may include computing a nominal synchronous reactance based on the stator voltages and currents for the PMSM, if a fault of the PMSM is indicated, receiving at the controller a stator voltages and currents for the faulted PMSM, computing a synchronous reactance associated with a faulted winding of the PMSM based on the stator voltages and currents for the PMSM, and determining a ratio of the synchronous reactance associated with a faulted winding to the nominal synchronous reactance. In addition the method further includes de-rating a torque rating for the PMSM based on the ratio of the synchronous reactance associated with a faulted winding to the nominal synchronous reactance.

In addition to one or more of the features described above, or as an alternative, further embodiments may include that the nominal synchronous reactance is computed based on the phase voltage, phase current and back emf for a respective winding of the PMSM when normally operating.

In addition to one or more of the features described above, or as an alternative, further embodiments may include that the synchronous reactance associated with a faulted winding is computed based on the phase voltage, phase current and back emf for a respective winding of the PMSM when a fault has occurred.

In addition to one or more of the features described above, or as an alternative, further embodiments may include that the de-rating is based on an inverse square of a ratio by which a number of turns of the PMSM is decreased from nominal.

Also described herein in an embodiment is a system for detecting a fault in a permanent magnet synchronous motor (PMSM), the system includes a PMSM; and a controller operably connected to the PMSM. The controller is configured to receive at the controller, stator voltages and currents for the PMSM, compute a negative sequence current and a negative sequence voltage for the PMSM, and determine if selected conditions are satisfied for monitoring for a fault of the PMSM. The controller is also configured to ascertain a change in the negative sequence current and a change in the negative sequence voltage for a selected time duration, calculate a ratio of the change of the negative sequence current and the negative sequence voltage to obtain a negative sequence admittance for the PMSM for a selected time duration, determine if at least one of a real and an imaginary part of the calculated ratio exceeds a first selected threshold, and identify the stator winding as faulted if the ratio exceeds the first selected threshold.

Also described herein in yet another embodiment is a motor drive system configured for detecting a fault in a permanent magnet synchronous motor (PMSM). The motor drive system includes an excitation source, a drive system operably connected to the excitation source and configured to provide motor command signals to the PMSM, and a controller operably connected to the PMSM. The controller is configured to receive at the controller stator voltages and currents for the PMSM, compute a negative sequence current and a negative sequence voltage for the PMSM, determine if selected conditions are satisfied for monitoring for a fault of the PMSM, and ascertain a change in the negative sequence current and a change in the negative sequence voltage for a selected time duration. The controller is also configured to calculate a ratio of the change a negative sequence current and the negative sequence voltage to obtain a negative sequence admittance for the PMSM for a selected time duration, determine if at least one of a real and an imaginary part of the calculated ratio exceeds a first selected threshold, and identify the stator winding as faulted if the ratio exceeds the first selected threshold.

The above features and advantages, and other features and advantages of the disclosure are readily apparent from the following detailed description when taken in connection with the accompanying drawings.

BRIEF DESCRIPTION OF THE DRAWINGS

Other features, advantages, and details appear by way of example only, in the following detailed description taken in connection with the accompanying drawings.

DETAILED DESCRIPTION

The following description is merely illustrative in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory module that executes one or more software or firmware programs, a combinational logic circuit, and/or other suitable components that provide the described functionality.

Additionally, the term "exemplary" is used herein to mean "serving as an example, instance or illustration" Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two. i.e. two, three, four, five, etc. The term "connection" can include an indirect "connection" and a direct "connection".

As shown and described herein, various features of the disclosure will be presented. Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Numerous vehicle manufacturers have committed to an electric future for many of their vehicle offerings. The automotive world ahead is all electric driven by fuel cells, batteries, or any other power source that is considered "clean." Battery technology has been steadily improving bringing the cost Kilowatt Hour down by about 75% since 2010. Moreover, the costs associated with batteries are projected to continue to decline through 2030 while power densities and reliability are expected to improve. By 2024, vehicle electrification worldwide is projected to increase to 30%, primarily driven by increasingly strict fuel economy requirements with some predicting that the sales of all electric vehicles in the world will surpass Internal Combustion Engines (ICE) by year 2038.

Permanent Magnetic Synchronous Motors (PMSM) are widely used in vehicle propulsion systems. Whether the propulsion system is hybrid, making use of internal combustion engines (ICE) together with electric motors to drive the wheels, or all electric, e.g., powered by fuel cells, or batteries, PMSM is commonly the motor of choice. Comparatively, the PMSM exhibits an excellent power/mass ratio as the use of rare earth magnets increases the magnetic flux density, thereby enabling a smaller, efficient motor construction. Moreover, these motors maintain full torque over a wide speed range and particularly at low speeds.

Electrical and environmental stress in electric machines causes gradual degradation of the insulation material that eventually leads to inter-turn short circuits in stator windings. Typically, the first symptoms of the stator winding degradation include stator overheating, unbalanced three-phase voltages and currents. Therefore, detection of shorted turn faults at their initial stage is advantageous for preventing major stator faults such as phase-to-ground or phase-to-phase faults, which could result in complete motor failure. Timely detection of the shorted turns also prevents damaging other stator coils and minimizes the impact on owner/operators. As vehicles become more complex and yet autonomous, it becomes even more important to detect, identify, and mitigate the effects of impending failures. Moreover in fleet operations (e.g., robo-taxis or delivery services), having such algorithms will help minimize the down time of vehicles.

Methods for stator winding fault diagnosis have been addressed in the past with varying success. Approaches ranging from negative sequence monitoring, to spectral analysis of the electrical signals associated with the PMSM, to data-driven approaches have been considered. Described herein, in one or more embodiments, is a method and system for stator winding fault diagnosis in an electric machine employing a fault detection algorithm based on negative sequence monitoring that exhibits improved accuracy and detection time. However, although relatively straight forward to implement, negative sequence monitoring poses certain challenges with respect to identifying parameters related to accurate computation of the negative sequence components that have heretofore limited its application.

Figure 1:
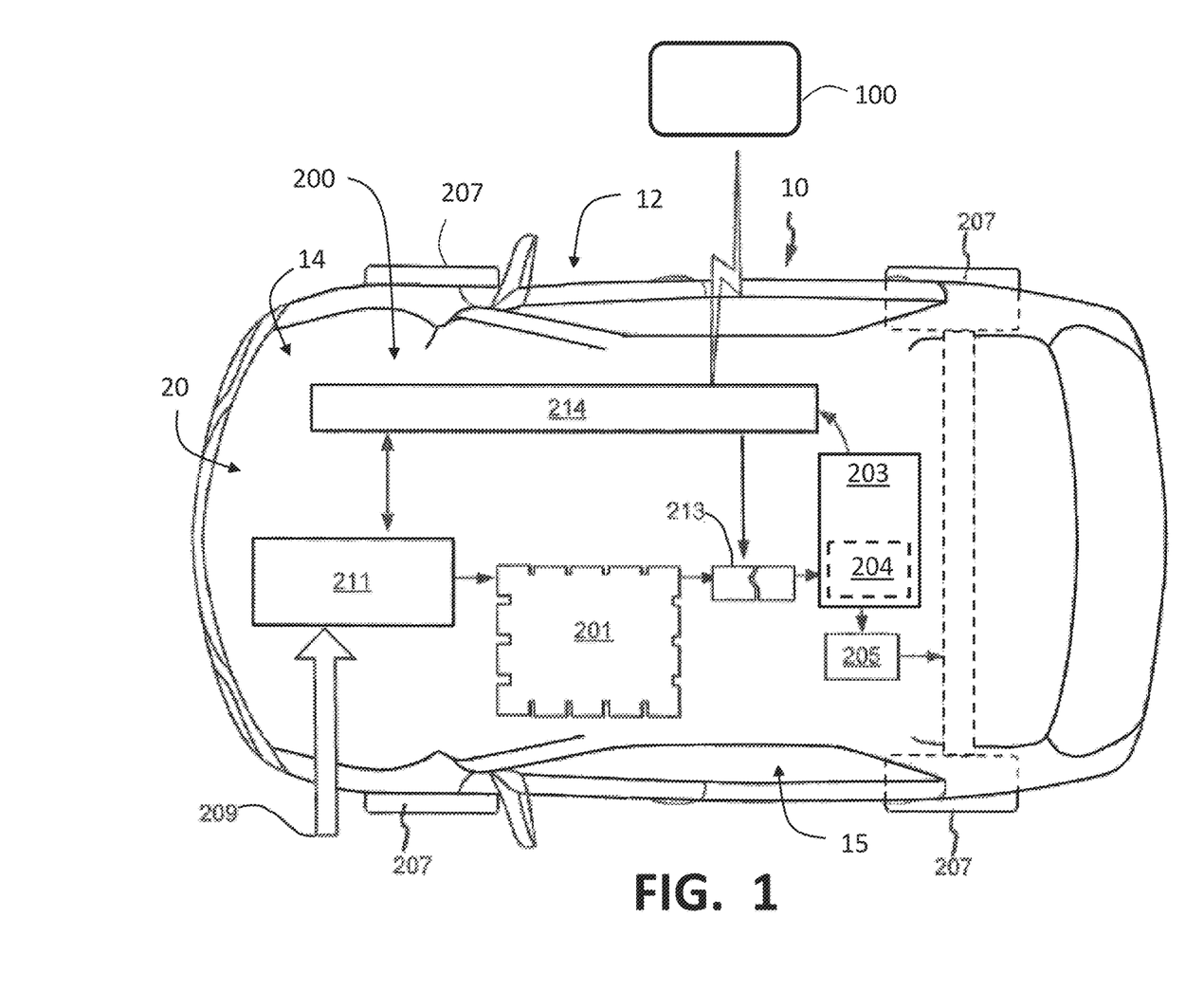
FIG. 1 depicts a motor vehicle including an internal combustion engine and motor control system according to one or more embodiments.

A motor vehicle, in accordance with an aspect of an embodiment, is indicated generally at 10 in FIG. 1. In particular, the vehicle 10 is a hybrid-electric or electric vehicle. FIG. 1 is a vehicle schematic showing the components of the vehicle of interest with the respect to the disclosed principles and the manner in which the components may be interrelated to execute those principles. It will be appreciated, however, that the illustrated architecture is merely an example, and that the disclosed principles do not require that the vehicle be configured precisely as shown. It is to be understood that motor vehicle 10 may take on various forms including automobiles, commercial transports, marine vehicles, and the like. Motor vehicle 10 includes a body 12 and a passenger compartment 15. In some embodiments, the motor vehicle 10 may also include an engine compartment 14 that houses all or part of a propulsion system 200. In some embodiments, the engine compartment 14 houses an internal combustion engine system ICE shown generally as 20, which, in some instances may be part of a hybrid implementation of the propulsion system 200. Internal combustion engine system 20 may also include a transmission (not shown) mechanically coupled to a drive train. It should be noted that the technical solutions described herein are germane to ICE systems and can include, but are not limited to, diesel engine systems and gasoline engine systems. The ICE 20 can include a plurality of reciprocating pistons attached to a crankshaft, which may be operably attached to a driveline, such as a vehicle driveline, to power a vehicle (e.g., deliver tractive torque to the driveline). For example, the ICE 20 can be any engine configuration or application, including various vehicular applications (e.g., automotive, marine and the like), as well as various non-vehicular applications (e.g., pumps, generators and the like). While the ICEs 20 may be described in a vehicular context (e.g., generating torque), other non-vehicular applications are within the scope of this disclosure. Therefore, when reference is made to a vehicle, such disclosure should be interpreted as applicable to any application of an ICE 20.

In other embodiments, the ICE 20 may be configured to provide power to an electric drive system in a hybrid configuration. For example, in one embodiment, the ICE 20 providing electric power to operate an electric propulsion system 200. In some embodiments, the propulsion system 200 and the internal may be mechanically coupled to a driveline to power the vehicle 10 (e.g., deliver tractive torque to the driveline).

Continuing with FIG. 1, in the illustrated example, the vehicle 10 and propulsion system 200 includes an electrical energy storage system 201, (e.g., a battery or battery bank ("battery")) of suitable voltage and capacity. Suitable battery types include but are not limited to lead acid batteries, Nickel Cadmium batteries (NiCd), Nickel Metal Hydride batteries (NiMH), Lithium Ion batteries, and Lithium Polymer batteries. The battery 201 is conductively linked. e.g., via a motor controller 203, to an electrical drive unit 205, e.g., an electrical motor or motors. (hereinafter electric motor 205). It will be appreciated that the electric power from the battery 201 may be modulated, voltage-modified, or otherwise modified by the motor controller 203 (or other devices) as needed to drive the electrical motor 205. In some embodiments the motor controller 203 may include a motor drive system 204. In other embodiments, a separate motor drive system 204 may be employed. Typically a motor drive system may include a voltage converter, inverter, and selecting transient filtering as described herein. The electric motor 205 is linked or linkable to a ground engaging drive, typically including one or more wheels 207. In some embodiments the electric motor 205 is a single electric motor operably connected to a mechanical drive train, in others, multiple motors may be employed to drive an axle or wheel 207 of the vehicle 10. For ease of illustration, a single motor 205 is depicted coupled to a single axle, but a variety of configurations are possible.

In one optional implementation, a plug interface 209 may be provided in order to charge the battery 201, although it will be appreciated that the teachings herein apply beyond vehicles having plug-in architectures as well. The plug interface 209 is linked to the battery 201 via a charge controller 211. An optional aspect of the vehicle 10 and battery 201 is the ability to electrically disconnect the battery 201 from the rest of the vehicle 10 by controlling at least one, and preferably two or more, high voltage contactors 213 if an adverse condition is detected. A communications interface 214 may also be employed and may be adapted to receive information from the controller 211, or motor controller 203 and to convey data regarding the vehicle 10, propulsion system 200 and the battery 201 to a remote system 100. In an embodiment the remote system 100 may be a server configured to receive vehicle status, maintenance, or fault information and the like. For example, in one embodiment the communications interface 214 provides state of charge and state of health information associated with the battery 201 to the remote system 100).

Figure 2:
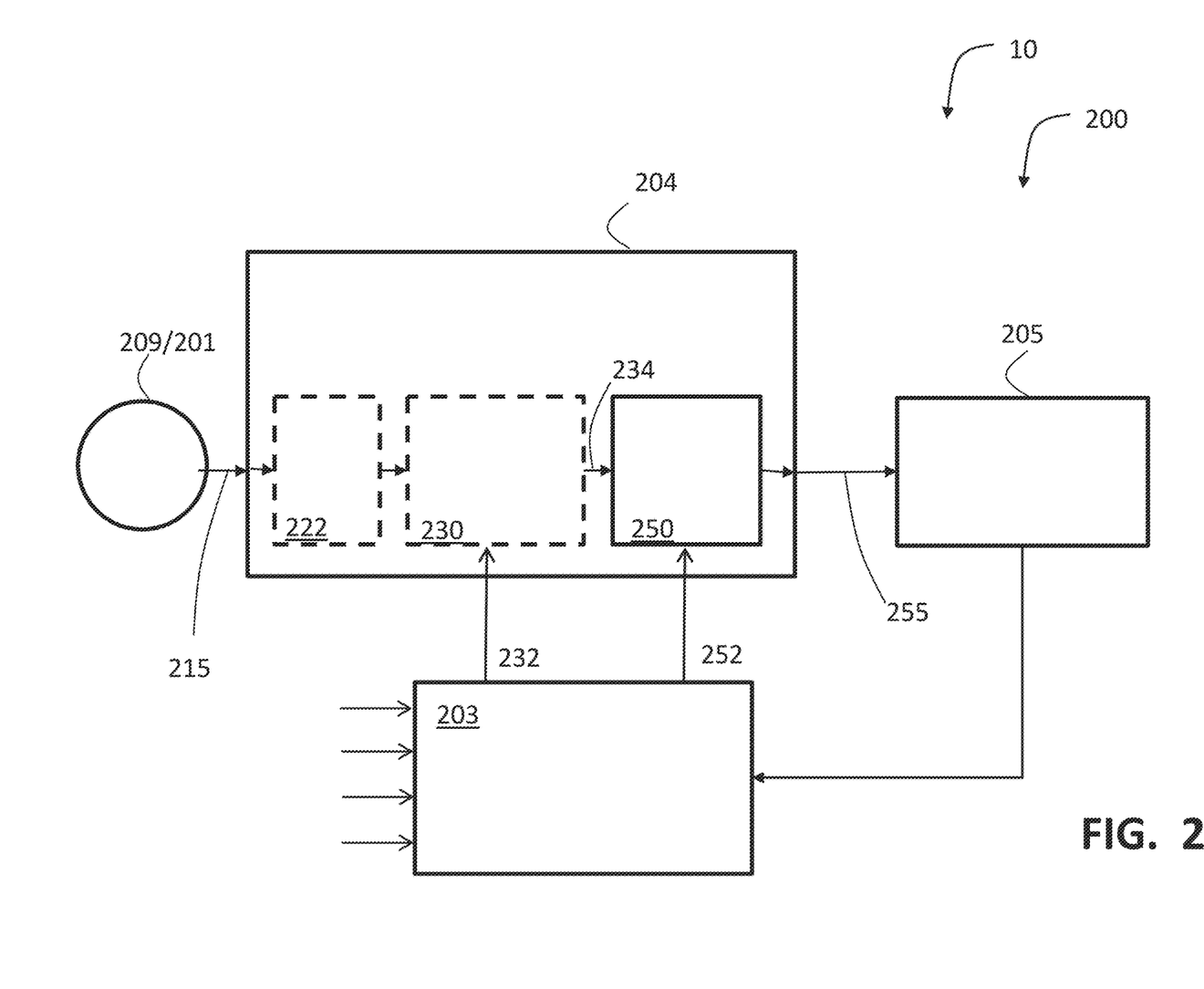
FIG. 2 depicts a high level block diagram of a motor drive system in accordance with one or more embodiments.

Continuing with the vehicle propulsion system 200, FIG. 2 is a block diagram of components of a propulsion system 200, and more specifically the motor controller 203, motor drive system 204, and electric motor 205 as may be employed to power the motor vehicle 10. The propulsion system 200 is described with respect to a power system for a motor vehicle 10, however application to any system where a control of a PMSM and/or motor drive system 204 is employed may be envisioned. Propulsion system 200 and motor drive system 204 includes a source of AC/DC power 201, such as an electrical main line, (e.g., 115/230 volt AC. e.g., via plug interface 209), power bus, DC power bus, (e.g., battery 201), and the like. The motor drive system 204 may optionally include a filter 222 configured to limit inrush currents, stabilize voltage levels, and suppress electromagnetic interference (EMI). The input power signals 215, once filtered (if employed), are provided to a converter 230 (or rectifier). The converter 230 is configured to convert the AC power 201 to a DC voltage. The converter 230 may also convert a DC voltage input to a different level DC voltage as may be required in the motor drive system 204. In an embodiment, the converter 230 is an active topology, employing a plurality of switching devices (not shown) and may be a single or multi-level configuration. Switching devices of the converter 230 are configured to provide conversion/rectification of the input voltage to supply the DC bus. The converter 230 may also be a simple passive rectifier, e.g., a diode bridge configured to rectify an AC voltage input to a DC voltage. The output of the converter 230 supplies a DC bus 234. A filter (not shown) may be employed stabilizing the DC bus 234 from transients and to suppress EMI.

The illustrated motor drive system 204 also includes an inverter 250, once again employing a plurality of switching devices to convert the DC voltage on the DC bus 234 to multiphase, AC drive motor command signals 255. Motor command signals 255 from the inverter 250 of the motor drive system 204 are supplied to a multiphase electric machine, (e.g., motor 205) to impart motion to the vehicle 10, power an environmental control system, and the like. In an exemplary embodiment, the electric motor 205 includes, but is not limited to, a multiphase, permanent magnet, synchronous motor (PMSM). It should also be appreciated, that while the embodiments herein are described primarily with reference to a vehicle 10 and a vehicle propulsion system 200 and its application, this description is for example only. The embodiments described here are readily applied to any application employing a three phase motor drive with a multiphase phase motor power application including motor controls, environmental control, control surface actuation, and any other power system and motor control application.

According to one or more embodiments, both converter 230 (if an active type) and inverter 250, are controlled by a controller 203. In an alternative embodiment, converter 230 and inverter 250 may be controlled by separate drive controllers, 203. Controller(s) 203 provides control signals 252 to the switching devices of the inverter 250 to control generation of the of the motor command signals 255. Likewise the controller 203 may provide control signals 232 to the active converter 230 to control generation and maintenance of the DC voltage on the DC bus 234. Controller 203 may be implemented using a general-purpose microprocessor executing a computer program stored on a storage medium to perform the operations described herein. Alternatively, controller 203 may be implemented in hardware (e.g., ASIC, FPGA) or in a combination of hardware/software.

In operation, in embodiments employing an active converter 230, the controller 203 develops a DC current command for the converter 230 based on the operation the motor 205 and the inverter 250 generating the motor command signals 255. The DC current command is then employed to formulate control signals 232 for the switching devices (not shown) of the converter 230 to provide a DC output current to the DC bus 234 accordingly. In addition, the controller 203 receives various input signals or values, including set point signals or values for desired output operation, such as DC bus voltage and current, phase voltages and currents of the input power, motor speed, position, torque, etc., as well as feedback signals or values representing operational values of various portions of the motor drive system 204. In another embodiment, a passive rectifier configuration for the converter 230 is employed and no commands from the controller 203 are needed. While such a configuration is advantageous because of its simplicity for employing passive rectifiers to supply the DC bus 234, other configurations with an active converter 230 may be desirable for improved current and electromagnetic interference (EMI) control. Likewise, the controller 203 develops a command for the inverter 250 based on the operation of the motor 205 (e.g., speed, torque, and the like) and the inverter 250 generating the motor command signals 255. The command is then employed to formulate the control signals 252 for the switching devices of the inverter 250 to formulate the motor command signals 255, accordingly.

A pulse width modulation (PWM) control scheme is employed to command the switching devices of the converter 230 to supply the DC bus 234 and the inverter 250 to generate and control the motor command signals 255 to the motor 205. Such a PWM control scheme employs space vector pulse width modulation SVPWM techniques. Moreover, the SVPWM for the converter 230 (if active) and inverter 250 would be operated at the same frequency and synchronized. However, in some applications, other PWM techniques may be employed to address the advantages and constraints imposed by the construction or particular implementation of the converter 230 or inverter 250. For example, discontinuous (DPWM) or even hybrid SVPWM techniques. Hybrid SVPWM is effectively a combination or hybrid of SVPWM and DPWM techniques. In the embodiments as described herein SVPWM techniques are employed.

Embodiments described herein are directed to a monitoring mechanism and methodology that can detect motor phase winding short circuits. In one embodiment, the methods described herein can detect and mitigate difficult to detect phase-to-phase short circuits within the motor windings. The described embodiments leverage the fact that the motor winding faults, under most conditions exhibit a variety of changes that can be monitored and detected while in operation. For example, in some instances a change in the phase synchronous impedance of a winding in the motor may be detected, quantified, and employed to indicate a fault. In other instances the impedance may not be sufficient, or a more rapid detection is desired. In some embodiments the negative sequence current and voltage are monitored and a change in the negative sequence current and or voltage may be employed as a means of detecting stator winding shorts in the electric machine. In yet another embodiment, the negative sequence admittance is employed for diagnosis in an electric machine employing a fault detection algorithm based on the negative sequence monitoring that exhibits improved accuracy and detection time. Thus, providing the ability to detect motor winding faults while operating or even commanded to stop and thereby facilitating enhanced failure/fault detection capability.

Figure 3A:
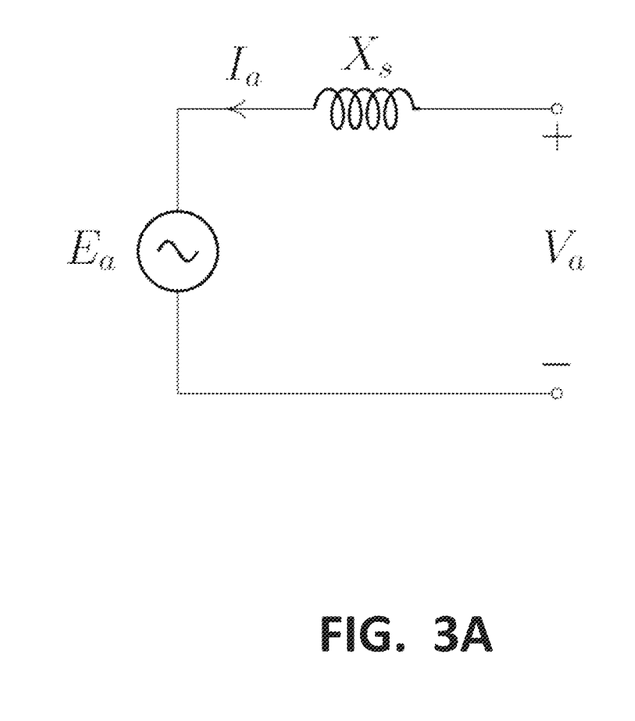
FIG. 3A depicts an example electrical circuit model for a motor winding in accordance with one or more embodiments.
Figure 3B:
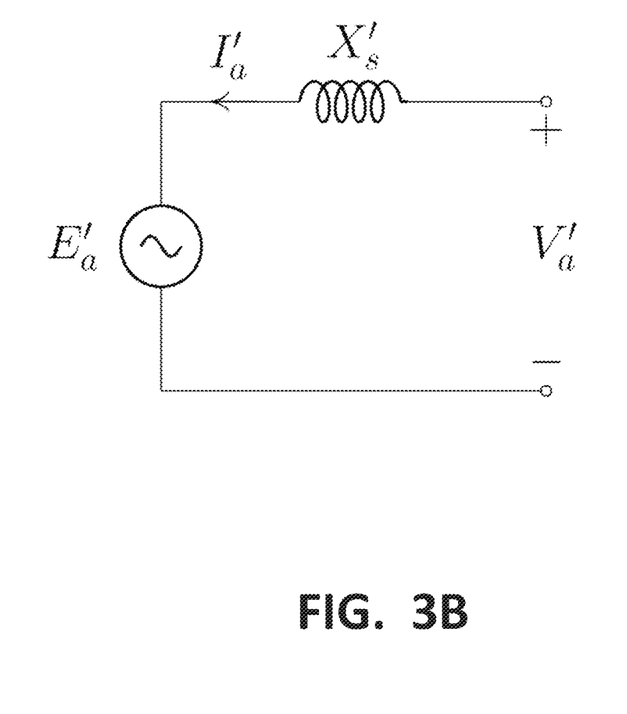
FIG. 3B depicts an example electrical circuit model for a faulted motor winding in accordance with one or more embodiments.

FIG. 3A depicts an electrical circuit model of a phase winding of the motor 205 in accordance with an embodiment. FIG. 3B depicts the same electrical circuit model of a phase winding of the motor 205 following a potential inter-turn fault. The phase voltage $V_a$ is defined as follows by Equation (1)

$$V_a = E_a + jX_s i_a \tag{1}$$

where $X_s$ is the synchronous reactance of the phase A winding.

In operation, $X_s \sim N^2$ and emf $E_a \sim N$ where N is the number of turns in the stator winding. As an inter-turn short occurs the values for the parameters above shift such that a new number of turns N is identified (based on some turns being shorted), resulting in a new synchronous reactance Xs and back emf $E_a$ as defined below:

$$N' = \frac{N}{r} \tag{2}$$

$$X'_s = \frac{X_s}{r^2} \tag{3}$$

$$E'_a = \frac{E_a}{r} \text{ and} \tag{4}$$

$$I'_a = rI_a \tag{5}$$

where r is the factor by which the number of turns is decreased and the primes denote the modified value for the circuit parameters resultant from the fault.

Therefore it becomes evident that as an inter-turn fault occurs the effective number of turns in the winding is decreased yielding an impact that the phase voltage $V_a$ decreases while the phase current $I_a$ increases. This characteristic become a fault signature that, if detectable, would aid in detecting, isolating and mitigating faults in the electric machine. In one embodiment, the inter-turn fault is determined based on the synchronous reactance changing from nominal by more than a selected threshold. For example, in one embodiment the selected threshold is 5%. In another embodiment, the selected threshold is 10%.

Once a fault in the motor 205 is detected, standard practice would be to disable the motor 205. However, because in some instances it may be possible that the inter-turn short is not too severe, and operation of the motor 205 may still be possible. In such instances, in an embodiment, once an inter-turn short is detected, advantageously, a method is described to address the fault, de-rate the motor to a lower power operating point and continue operation if possible. To facilitate operation at a lower operating point the derating is made based on the change in the synchronous reactance $X_s$. In one embodiment the deration of torque is based on the change in the synchronous reactance $X_s$ as described below.

Using the electrical circuit model and considering all three phases, electrical power of the load of the motor can be computed using the following equation:

$$P = -\frac{3}{2}\frac{|V_a||E_a|}{X_s}\sin(\delta) \tag{6}$$

where P is the electrical power of the load of the motor.

Electrical power P can also be approximated by taking the product of the measured mechanical speed Ω and torque T as follows:

$$P \approx \Omega T \tag{7}$$

where Ω is the mechanical speed of the motor. By using EQ. 1 and EQ. 6, synchronous reactance $X_s$ can be computed to be:

$$X_s = \frac{|V_a|}{|I_a|\sin\psi + \text{sgn}(\cos(\delta))a} \quad (8)$$

where $\psi$ is the power factor angle between voltage phasor $V_a$ and current phasor $I_a$, and $$a = \sqrt{\frac{\frac{4}{9}P^2}{|V_a|^2\sin^2(\delta)} - |I_a|^2\cos^2(\psi)} \quad (9)$$

By using EQ. 8, pre-fault (nominal) value of the synchronous reactance $X_s$ and new post-fault value $X'_s$ can be computed. Based on the pre-fault and post-fault values $X_s$ and $X'_s$, the torque of the motor 205 is derated to a new post-fault value T'=T/r where r is the factor by which the number of turns of the motor have been reduced by due to the fault. It can be appreciated that to de-rate torque in proportion to the number of turns lost, since r can't be directly calculated, instead it is possible to employ the ratio of $X'_s$ & $X_s$ to estimate it.

$$T' = T\sqrt{\frac{X'_s}{X_s}} \quad (10)$$

Of note, Equation 10 is analogous to Equation 3 based on the ratio of the ratio of the pre and post fault synchronous reactance values $X_s$ & $X'_s$. It should be appreciated that while for an embodiment derating by the square root of the ratios of the new synchronous reactance $X'_s$ to the original synchronous reactance $X_s$ is employed, other derating schemes are possible and envisioned. For example, while in an embodiment the deration is based on torque, in another embodiment, the derating could be based on speed, voltage, and the like.

Figure 4A:
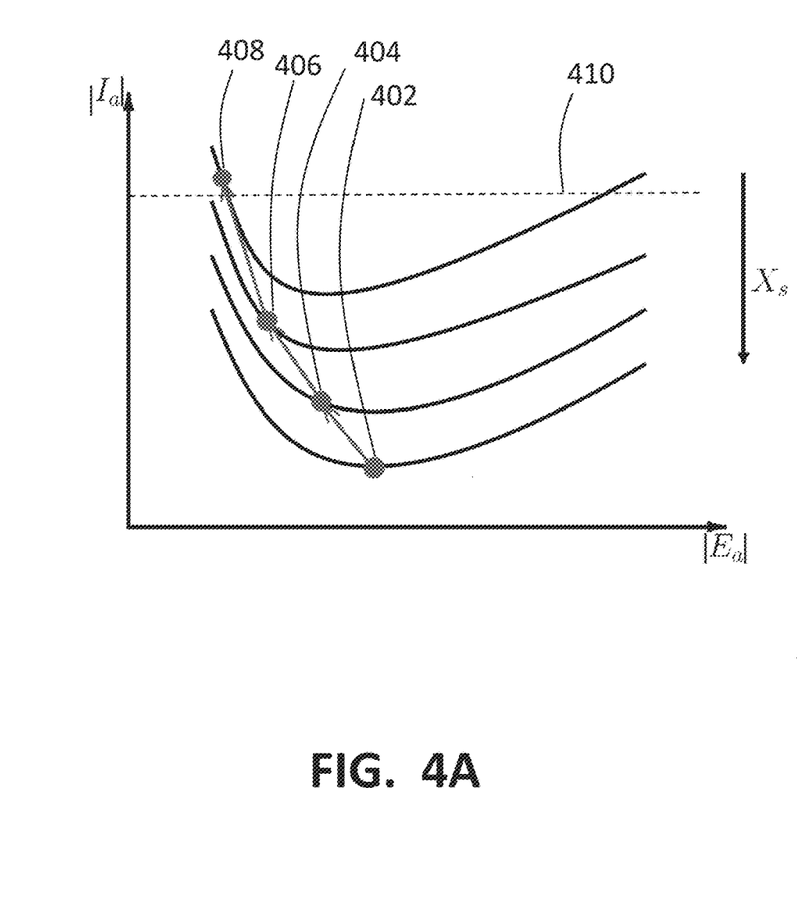
FIG. 4A depicts example current and voltage "vee" curves for a motor winding in accordance with one or more embodiments.
Figure 4B:
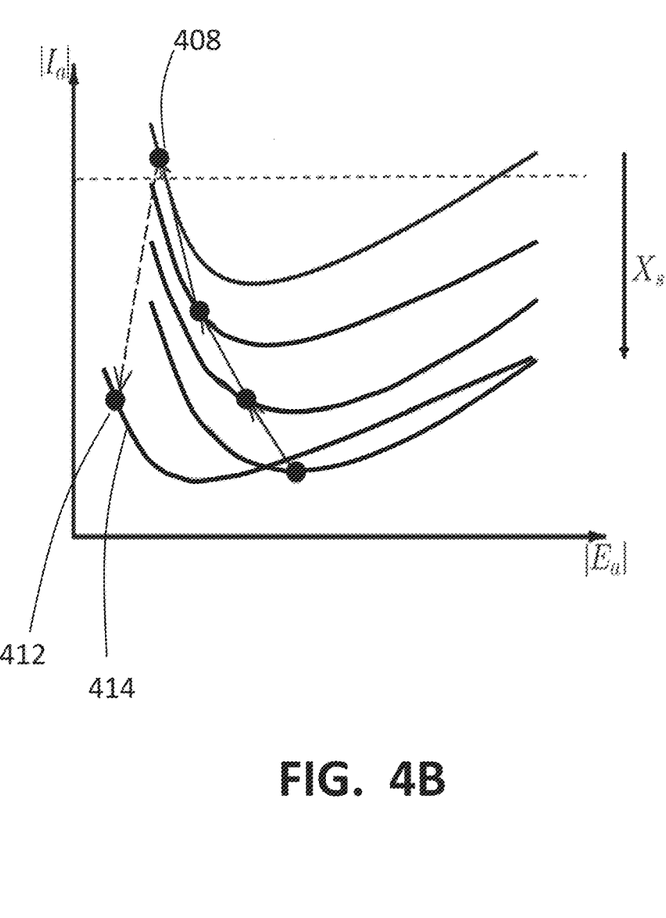
FIG. 4B depicts example current and voltage "vee" curves for a motor winding with faults in accordance with one or more embodiments.

FIGS. 4A and 4B depict a family of current versus voltage "vee" curves for a winding (phase A) of the motor 205 as a function of the synchronous reactance $X_s$ as may be exhibited by a motor 205 winding when experiencing winding faults. As the synchronous reactance $X_s$ decreases, the operation point of the motor 205 moves to increasing currents and decreasing voltages, as depicted by reference points 402, 404, 406, 408, until a thermal limit 410 for the motor 205 is exceeded. In an embodiment, to mitigate such failures, upon the detection of a failure the torque of the motor 205 may be de-rated to a lower level with a new operating point 412 on a vee curve 414 commensurate with the new value for the synchronous reactance $X_s$.

Figure 5:
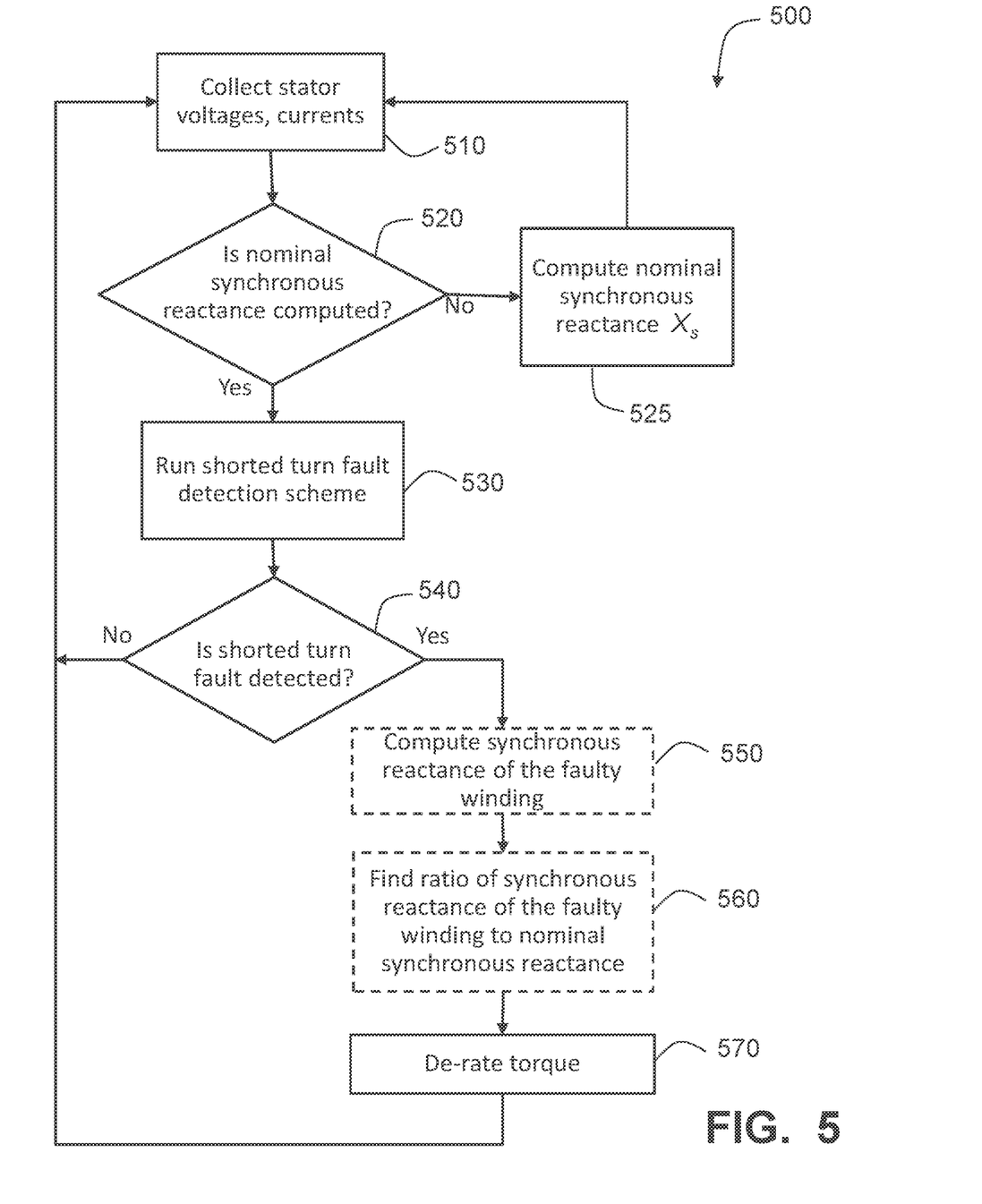
FIG. 5 is a flowchart of a method of detecting faults and mitigating faults in a permanent magnet motor in accordance with one or more embodiments.

FIG. 5 is a flowchart of a method 500 for detecting and mitigating faults in a PMSM in accordance with an embodiment. One or more steps of the method 500 may be implemented by controller 203 of the vehicle propulsion system 200, as described herein. Moreover, some steps of the method 500 may be implemented as software or algorithms operating on the controller 203. The method 500 initiates with collecting of various data and parameters regarding the motor 205 and the propulsion system 200, including, but not limited to the stator voltages and currents associated with a motor 205 as depicted at process step 510. The collection of the data and parameters may be recursive as needed to collect the desired data and implement the processes associated with diagnosing the status of the motor 205 and the propulsion system 200. Continuing with the figure, at process step 520 the method 500 continues with determining if the nominal synchronous reactance has been computed. If it has not, the process is diverted to process step 525 for computing of the nominal synchronous reactance, following which the method 500 reiterates to process step 510 to repeat. Conversely, if at process block 520 is ascertained that the nominal synchronous reactance has been computed, then the process 500 continues to process block 530 and executes one or more shorted turn detection scheme (s). In an embodiment, a simple scheme for detecting a shorted turn can be based on the change in the synchronous reactance $X_s$ as described above. In another embodiment, the detection could be based on the negative sequence current and/or voltage, or a change thereof. In another embodiment the detection could be a based on the negative sequence impedance, or the negative sequence admittance as described herein.

Continuing with FIG. 5 and returning to FIG. 4B as well, at process step 540 if no shorted turn fault is detected, the process reiterates, transitioning back to process step 510 to repeat. However if a shorted turn fault is detected at process step 540, then the method continues with process step 570 to de-rate the torque capability of the motor 205. Optionally, one way that the motor torque T can be derated is depicted in optional process steps 550 and 560. At process step 550, a new value for the synchronous reactance $X'_s$ for the faulty winding of the motor 205 is computed as depicted at 412 (FIG. 4B), while at process step 560 the ratio of the new synchronous reactance $X_s$ to the nominal synchronous reactance $X_s$ is computed and is employed in determining how much to de-rate the motor 205 torque based on the detected fault in accordance with Equation 10. In this manner a process is describe which permits the detection of a motor 205 fault and moreover permits the continued operation, of the motor 205, albeit, in a derated capacity, despite the detected fault. This provides for a highly beneficial improvement of existing schemes that typically would disable the motor 205 upon the detection of any fault.

Figure 6:
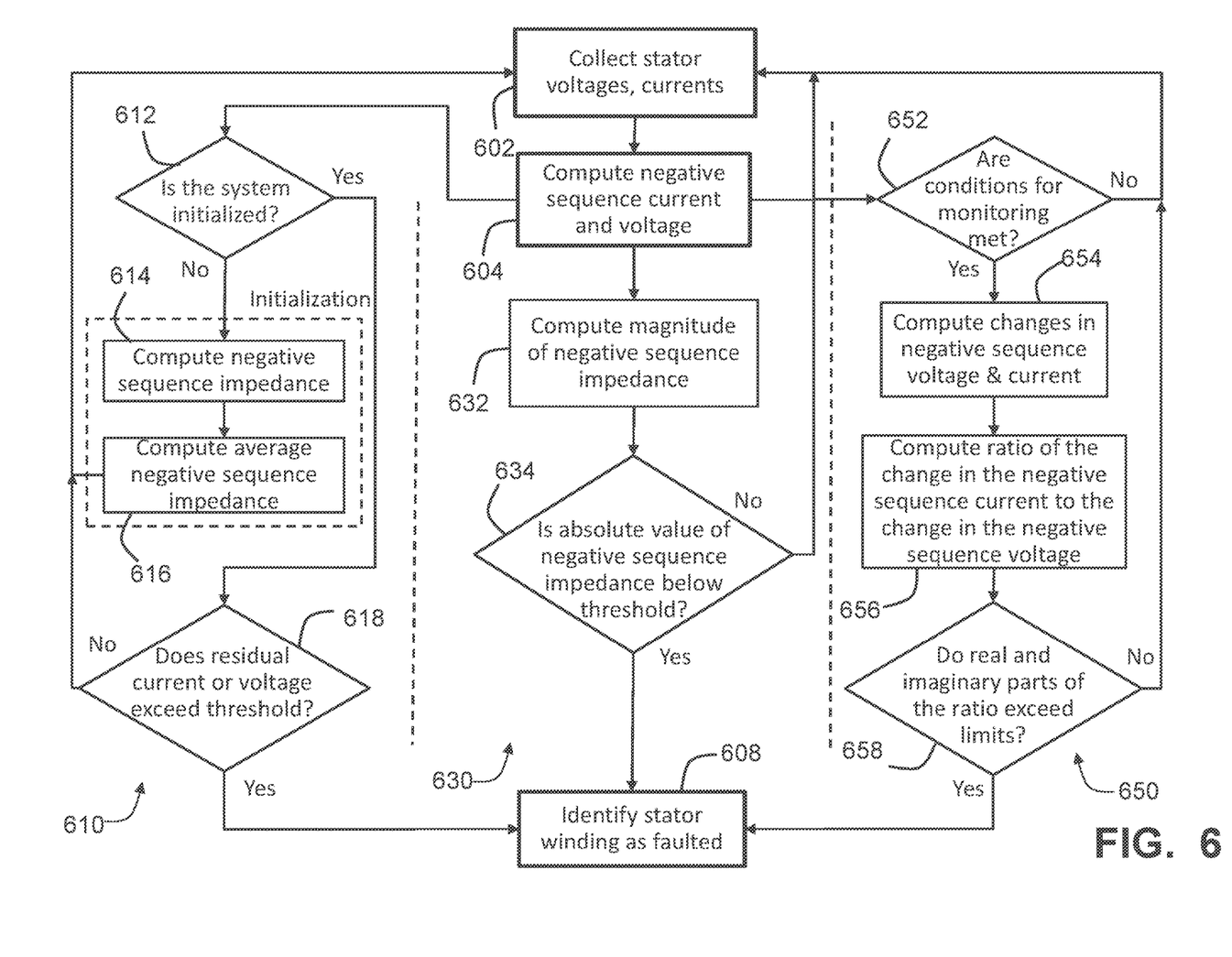
FIG. 6 is a flowchart of a plurality of methods of detecting faults in a permanent magnet motor in accordance with one or more embodiments.

Turning now to FIG. 6 as well, details associated with yet another method for detecting a fault in motor 205 are depicted and described. Returning to FIGS. 3A and 3B depict a circuit model for an example motor phase in a nominal (normal) and failed state (once an inter-turn short has occurred). Once again, looking to Equations (1)-(5), as noted herein, as an inter-turn fault occurs the effective number of turns in the winding is decreased such that the phase voltage $V_a$ decreases while the phase current $I_a$ increases. In another embodiment, the phase currents $I_a$, $I_b$, $I_c$ and phase voltages $V_a$, $V_b$, $V_c$, may be written/rewritten in terms of the their positive sequence, negative sequence and zero sequence terms, denoted $V_p$, $V_m$, $V_0$, and $I_p$, $I_m$, $I_0$ respectively as:

$$\begin{pmatrix} V_p \\ V_n \\ V_0 \end{pmatrix} = \begin{pmatrix} 1 & a & a^2 \\ 1 & a^2 & a \\ 1 & 1 & 1 \end{pmatrix} \begin{pmatrix} V_a \\ V_b \\ V_c \end{pmatrix} \quad (11)$$

and $$\begin{pmatrix} I_p \\ I_n \\ I_0 \end{pmatrix} = \begin{pmatrix} 1 & a & a^2 \\ 1 & a^2 & a \\ 1 & 1 & 1 \end{pmatrix} \begin{pmatrix} I_a \\ I_b \\ I_c \end{pmatrix} \quad (12)$$

where $a=1\angle 120°$.

With Equations 11 and 12 it is noteworthy to appreciate that as an inter-turn fault occurs the phase voltage $V_a$ decreases while the phase current $I_a$ increases, and likewise, the negative sequence voltage $V_a$ and negative sequence current $I_n$ deviate from zero. That is, it should be understood that for a balanced motor, the negative sequence voltage $V_n$ and negative sequence current $I_n$ would be zero. However, in the presence of an inter-turn fault, the negative sequence voltage $V_n$ and negative sequence current $I_n$ will deviate from zero. In the described embodiment, this deviation is leveraged to provide for improved fault detection, isolation, and mitigation of faults in the electric machine 205. To that end, in an embodiment, the negative sequence current $I_n$ may be characterized as:

$$I_n = Y_b V_n + f(V_p, \Omega, T_e) \quad (13)$$

where $Y_n$ is the negative sequence admittance, $V_p$ and positive sequence voltage, $\Omega$ is the mechanical speed of the motor 205, and $T_e$ is the torque. Unfortunately, the function term is difficult to characterize and, as such, has heretofore precluded employing the negative sequence admittance $Y_n$ as a means of identifying and characterizing motor faults.

Equation 13 can be rewritten for a given time instance between samples denoted k and the next time instance denoted k+1 as follows:

$$I_n(k) = Y_n V_n(k) + f(V_p(k), \Omega(k), T_e(k)), \text{ and} \quad (14)$$

$$I_n(k+1) = Y_n V_n(k+1) + f(V_p(k+1), \Omega(k+1), T_e(k+1)) \quad (15)$$

Subtracting Equation 14 from Equation 15 yields:

$$\Delta I_n(k+1) = Y_n \Delta V_n(k+1) + f(V_p(k+1), \Omega(k+1), T_e(k+1)) - f(V_p(k), \Omega(k), T_e(k)) \quad (16)$$

It is noteworthy to appreciate that for a small enough sampling time step, and based on ensuring values for $\alpha$, $\beta$, $\gamma$, such that:

$$|V_p(k) - V_p(k+1)| < \alpha,$$

$$|\Omega(k) - \Omega(k+1)| \leq \beta,$$

$$|T_e(k) - T_e(k+1)| < \gamma.$$

It can then be assumed that:

$$f(V(k+1), \Omega(k+1), T_e(k+1)) \approx f(V_p(k), \Omega(k), T_e(k)).$$

As a result, the function terms will cancel and drop from equation 16 yielding a simplification of:

$$\Delta I_n(k+1) \approx Y_n \Delta V_n(k+1) = Y_n \approx \frac{\Delta I_n}{\Delta V_n} = G_n + jB_n \quad (17)$$

for the negative sequence admittance $Y_n$, which is accurate for a large enough $\Delta V_n$ and $V_p$ yet small enough $\alpha$, $\beta$, $\gamma$. It should be noted that a large $\Delta V_n$ dominates the approximation. Advantageously, computing $$Y_n \approx \frac{\Delta I_n}{\Delta V_n}$$

proves to be more accurate in that when computing $$Z_n = \frac{V_n}{I_n},$$

the term $f(V_p, \Omega, T_e)$ is neglected. However, when computing the term $$\frac{\Delta I_n}{\Delta V_n}, f(V_p, \Omega, T_e)$$

is taken into account defining when the approximation is more accurate and thereby, yielding, a more accurate computation. That is, it is noteworthy to appreciate that when $$\frac{\Delta I_n}{\Delta V_n}$$

is computed when $\Delta V_n$ and $V_p$ are above certain thresholds. In addition it may be noted that the approximation error $f(V_p(k+1), \Omega(k+1), T_r(k+1)) - f(V(k), \Omega(k), T_e(k))$ is dominated by large enough $\Delta V_n$, which presents a further reason for the approximation employing $$Y_n \approx \frac{\Delta I_n}{\Delta V_n}$$

under the prescribed conditions proves favorable over $$Z_n = \frac{V_n}{I_n}.$$

It should also be appreciated that for the thresholds, no specific value is to be defined as they may be tailored for different types of motors, and may be preselected and calibrated at initial setup. Therefore, it can be seen that for a small enough time step, i.e., fast enough sample rate, the negative sequence admittance $Y_n$ provides an improved indicator of motor faults. In an embodiment a time step of about 100-500 microseconds is employed, however it should be understood that the sampling rate e.g., time step duration may be selected based on a variety of system factors and dynamics including motor characteristics for the PMSM and dynamics, including speed, as well as the PWM rate.

Continuing now to FIG. 6, which is a flowchart of three methods 610, 630, and 650 (partially segregated by the dashed lines for clarity) for detecting and mitigating faults in a PMSM in accordance with an embodiment. Each, or any of the three methods may optionally be running simultaneously. In an embodiment, it may be advantageous to operate all three methods because one method may detect a fault quicker than another. Earliest detection of a fault in the motor 205 is advantageous as it permits mitigation opportunities, for example de-rating the motor 205, before further damage is experienced. Once again, one or more steps of the methods may be implemented by controller 203 of the vehicle propulsion system 200 as described herein. Moreover, some steps of the methods 610, 630, and 650 may be implemented as software or algorithms operating on the controller 203. The methods 610, 630, and 650 each initiates with collecting of various data and parameters regarding the motor 205 and the propulsion system 200, including, but not limited to the stator voltages and currents associated with a motor 205 as depicted at process step 602. The collection of the data and parameters may recursive as needed to collect the desired data and implement the processes associated with diagnosing the status of the motor 205 and the propulsion system 200. Continuing with the figure, at process step 604 the methods 610, 630, and 650 each continues with computing the negative sequence current $I_n$ and negative sequence voltage $V_n$. Turning first to the method 610 at process decision block 612 it is determined if the system has been initialized. If it has not, the process is diverted to process step 614 for computing of the negative sequence impedance, following which the method 610 continues to process step 616 for computing of the average negative sequence impedance. This completes the initialization and the method returns to process block 602 to reiterate the methods 610 (as well as 630 and 650 if used). Returning to process decision block 612 if the system was initialized, the method 610 transitions to process decision block 618 to determine if either one of or both the residual negative sequence current or negative sequence voltage exceeds a selected threshold. For example, in one embodiment a threshold of 10% above nominal negative sequence current and negative sequence voltage may be employed, though other threshold values are possible. The residual may be computed by comparing the negative sequence current $I_n$ and negative sequence voltage $V_n$ as computed at process step 604 with the average value of the negative sequence current $I_n$ and negative sequence voltage $V_n$ from the average negative sequence impedance $avgZ_n$ as computed during the initialization in process step 616. If the residual is less than the selected threshold, then no fault is detected and the process reverts and reiterates to process block 602. Conversely, if at process decision block 618 it is ascertained that the residual equals or exceeds the selected threshold, then the method 610 continues to common process block 608 and a stator winding fault of the motor 205 is indicated.

Continuing with FIG. 6 and now turning to the method 630 for a second method of detecting a shorted turn in the motor 205. The method initiates as the method 610 did with process block 602 and 604 and the computation of the negative sequence current $I_n$ and negative sequence voltage $V_n$. The method 630 continues at process block 632 with computing of the magnitude of the negative sequence impedance $|Z_n|$. The method 630 transitions to process decision block 634 to determine if the magnitude of the negative sequence impedance $|Z_n|$ exceeds a selected threshold. For example, in one embodiment a threshold 10% less than the nominal value may be employed, though other threshold values are possible. If the absolute value of the negative sequence impedance $|Z_n|$ is greater than or equal to the selected threshold, then no fault is detected and the process reverts and reiterates to process block 602. Conversely, if at process decision block 634 it is ascertained that the absolute value of negative sequence impedance $|Z_n|$ is less than the selected threshold, then the method 630 continues to common process block 608 and a stator winding fault is indicated.

Continuing with FIG. 6 and now turning to the method 650 for a third method of detecting a shorted turn in the motor 205. The method 650 uniquely employs the negative sequence admittance $Y_n$ as described above for detection and determination of a motor fault. The method 650 initiates as the method 610, and 630 did with process block 602 and 604 and the computation of the negative sequence current $I_n$ and negative sequence voltage $V_n$. The method 650 continues at process decision block 652 with determining if the satisfactory conditions for monitoring have been met. If not, the process reverts and reiterates to process block 602 as depicted. Otherwise, if the monitoring conditions are satisfied, the method 650 continues to process block 654. The conditions for monitoring include, but are not limited to, the conditions identified above associated with the approximation for the negative sequence admittance $Y_n$, that is a larger enough $\Delta V_n$ and $V_p$, yet small enough values for α, β, γ. Continuing with the method 650 the change in the negative sequence voltage $\Delta V_n$ and the change in the negative sequence current $\Delta I_n$ are computed as depicted at process block 654. It will be appreciated that there may not be a specific identified value for α, β, γ. Generally, each tolerance may be tuned depending on a particular type of motor employed. In an embodiment, in one example a $\Delta V_n$ threshold of 1 volt, with a Vp threshold of 10V, α=10 V, β=100 rpm, γ=30 Nm may be employed. At process block 656, the ratio of the change in the negative sequence current $\Delta I_n$ to the change in the negative sequence voltage $\Delta V_n$ is computed to approximate the negative sequence admittance $Y_n$. Lastly, the method 650 transitions to process decision block 658 to determine the negative sequence admittance $Y_n$ and compared it to its nominal value. If in the deviation of the negative sequence admittance $Y_n$, from nominal is less than a selected threshold, then no fault is detected and the process reverts and reiterates to process block 602. Conversely, if at process decision block 658 it is ascertained that the deviation from nominal of the ratio equal or exceed the selected threshold, then the method 650 continues to common process block 608 and a stator winding fault is indicated. Nominal negative sequence admittance values depends on a dynamic characteristics of the PMSM, the inherent asymmetries of the stator coils of the PMSM, inherent asymmetry in the motor design and unbalanced power supply. For example, in one embodiment a threshold 10% less than the nominal value may be employed, though other threshold values are possible.

In this manner, multiple processes are described which permit the detection of a motor 205 fault and moreover permits the continued operation, of the motor 205, albeit, in a derated capacity, despite the detected fault. Furthermore the method may optionally include controlling the motor 205 based on the identified fault. The controlling may include operating in a degraded manner, e.g., with de-rated torque if possible (depending on other factors in the system, or if necessary disabling the PMSM. This provides for a highly beneficial improvement of existing schemes that typically would disable the motor 205 upon the detection of any fault.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiments may be a system, a method, and/or a computer program product at any possible technical detail level of integration. The computer program product may include a computer readable storage medium (or media)

having computer readable program instructions thereon for causing a processor to carry out aspects of the present disclosure.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of detecting a fault in a permanent magnet synchronous motor (PMSM), operably connected to a controller, the method comprising:
   receiving at a controller a stator voltages and currents for the PMSM;
   computing a negative sequence current and a negative sequence voltage for the PMSM;
   determining if selected conditions are satisfied for monitoring for a fault of the PMSM;
   ascertaining a change in the negative sequence current and a change in the negative sequence voltage for a selected time duration;
   calculating a ratio of the change in the negative sequence current and the change in the negative sequence voltage corresponding to a negative sequence admittance for the PMSM;
   determining if the negative sequence admittance differs from nominal in excess of a first selected threshold; and
   identifying the stator winding as faulted if the ratio exceeds the first selected threshold;
   wherein determining if selected conditions are satisfied includes ensuring that the change in the negative sequence voltage $\Delta V_n \geq$ a second selected threshold, and a positive sequence voltage $V_p \geq$ a third selected threshold; and wherein a change in positive sequence voltage over the selected time duration < a respective threshold $\alpha$, a change in a speed of the PMSM over the selected time duration < a respective threshold $\beta$, and a change in a torque of the PMSM over the selected time duration < a respective threshold $\gamma$, wherein $\alpha$, $\beta$, and $\gamma$ are tuned in relation to the PMSM.

2. The method of claim 1, wherein the second selected threshold is one volt and the fourth selected threshold is 10 volts.

3. The method of claim 1, wherein the selected duration is chosen to ensure that conditions for monitoring are satisfied.

4. The method of claim 3, wherein the selected duration is based on a sampling period.

5. The method of claim 1, wherein the negative sequence admittance corresponds to ratio of the change a negative sequence current and a negative sequence voltage.

6. The method of claim 1, wherein the first selected threshold is based on a nominal negative sequence admittance value identified under normal operating conditions.

7. The method of claim 6, wherein the first selected threshold is 10% of a nominal value.

8. The method of claim 1, further including:
   computing a negative sequence impedance from the negative sequence current and the negative sequence voltage;
   computing an absolute value of the negative sequence impedance;
   determining if the absolute value of the negative sequence impedance is less than a fourth selected threshold; and
   identifying the stator winding as faulted if the absolute value of the negative sequence impedance is less than the fourth selected threshold.

9. The method of claim 8, wherein the fourth selected threshold is based on a deviation from a nominal negative sequence impedance value.

10. The method of claim 9, wherein the fourth selected threshold is 10% of a nominal negative sequence impedance value.

11. The method of claim 1, further including:
    computing a negative sequence impedance from the negative sequence current and the negative sequence voltage;
    computing an average value of the negative sequence impedance;
    determining if the residual of at least one of the negative sequence current and negative sequence voltage exceeds a fifth selected threshold; and
    identifying the stator winding as faulted if the residual of at least one of the negative sequence current and negative sequence voltage exceeds the fifth selected threshold.

12. The method of claim 11, wherein the fifth selected threshold is based on a deviation from the nominal averaged negative sequence impedance under normal conditions.

13. The method of claim 12, wherein the fifth selected threshold is 10% of the nominal negative sequence impedance.

14. The method of claim 1, further including:
    computing a negative sequence impedance from the negative sequence current and the negative sequence voltage;
    computing a magnitude of the negative sequence impedance;
    determining if the magnitude of the negative sequence impedance is less than a sixth selected threshold; and
    computing an average value of the negative sequence impedance;
    determining if the residual of at least one of the negative sequence current and negative sequence voltage exceeds a seventh selected threshold; and
    identifying the stator winding as faulted based the fastest of:

determining if the negative sequence admittance differs from a nominal value in excess of the first selected threshold; and determining if the magnitude of the negative sequence impedance is less than the sixth selected threshold, and determining if the residual of at least one of the negative sequence current and negative sequence voltage exceeds the seventh selected threshold.

15. The method of claim 1, further including controlling the PMSM based on the identifying of a faulted stator winding of the PMSM.

16. The method of claim 1, wherein controlling the PMSM based on the identifying of a fault includes disabling the PMSM.

17. The method of claim 1, further comprising:
computing a nominal synchronous reactance based on the stator voltages and currents for the PMSM and if a fault of the PMSM is indicated:
receiving at the controller a stator voltage and current for the faulted PMSM;
computing a synchronous reactance associated with a faulted winding of the PMSM based on the stator voltages and currents for the PMSM;
determining a ratio of the synchronous reactance associated with a faulted winding to the nominal synchronous reactance; and
de-rating a torque rating for the PMSM based on the ratio of the synchronous reactance associated with a faulted winding to the nominal synchronous reactance.

18. The method of claim 17, wherein the nominal synchronous reactance is computed based on the phase voltage, phase current and back emf for a respective winding of the PMSM when normally operating.

19. The method of claim 17, wherein the synchronous reactance associated with a faulted winding is computed based on the phase voltage, phase current and back emf for a respective winding of the PMSM when a fault has occurred.

20. The method of claim 17, wherein the de-rating is based on an inverse square of a ratio by which a number of turns of the PMSM is decreased from nominal.

21. A system for detecting a fault in a permanent magnet synchronous motor (PMSM), the system comprising:
a PMSM; and
a controller operably connected to the PMSM, the controller configured to:
receive at the controller stator voltages and currents for the PMSM;
compute a negative sequence current and a negative sequence voltage for the PMSM;
determine if selected conditions are satisfied for monitoring for a fault of the PMSM;
ascertain a change in the negative sequence current and a change in the negative sequence voltage for a selected time duration;
calculate a ratio of the change in the negative sequence current and the change in the negative sequence voltage corresponding to a negative sequence admittance for the PMSM for a selected time duration;
determine if the negative sequence admittance differs from nominal in excess of a first selected threshold; and
identify the stator winding as faulted if the ratio exceeds the first selected threshold;
wherein determining if selected conditions are satisfied includes ensuring that the change in the negative sequence voltage $\Delta V_n \geq$ a second selected threshold, and a positive sequence voltage $V_p \geq$ a third selected threshold; and wherein a change in positive sequence voltage over the selected time duration < a respective threshold $\alpha$, a change in a speed of the PMSM over the selected time duration < a respective threshold $\beta$, and a change in a torque of the PMSM over the selected time duration < a respective threshold $\gamma$, wherein $\alpha$, $\beta$, and $\gamma$ are tuned in relation to the PMSM.

22. A motor drive system configured for detecting a fault in a permanent magnet synchronous motor (PMSM), the system comprising:
an excitation source;
a drive system operably connected to the excitation source and configured to provide motor command signals to the PMSM; and
a controller operably connected to the PMSM, the controller configured to:
receive at the controller stator voltages and currents for the PMSM;
compute a negative sequence current and a negative sequence voltage for the PMSM; and
determine if selected conditions are satisfied for monitoring for a fault of the PMSM;
ascertain a change in the negative sequence current and a change in the negative sequence voltage for a selected time duration;
calculate a ratio of the change in the negative sequence current and the change in the negative sequence voltage corresponding to a negative sequence admittance for the PMSM for a selected time duration;
determine if the negative sequence admittance differs from a nominal value in excess of a first selected threshold; and
identify the stator winding as faulted if the ratio exceeds the first selected threshold;
wherein determining if selected conditions are satisfied includes ensuring that the change in the negative sequence voltage $\Delta V_n \geq$ a second selected threshold, and a positive sequence voltage $V_p \geq$ a third selected threshold; and wherein a change in positive sequence voltage over the selected time duration < a respective threshold $\alpha$, a change in a speed of the PMSM over the selected time duration < a respective threshold $\beta$, and a change in a torque of the PMSM over the selected time duration < a respective threshold $\gamma$, wherein $\alpha$, $\beta$, and $\gamma$ are tuned in relation to the PMSM.

* * * * *